(12) United States Patent  (10) Patent No.: US 7,781,668 B2
Sasaki et al.  (45) Date of Patent: Aug. 24, 2010

(54) SUBSTRATE FOR THIN-FILM SOLAR CELL, METHOD FOR PRODUCING THE SAME, AND THIN-FILM SOLAR CELL EMPLOYING IT

(75) Inventors: Toshiaki Sasaki, Shiga (JP); Yohei Koi, Shiga (JP); Yuko Tawada, Osaka (JP); Kenji Yamamoto, Hyogo (JP)

(73) Assignee: Kaneka Corporation, Osaka (JP)

( * ) Notice: Subject to any disclaimer, the term of this patent is extended or adjusted under 35 U.S.C. 154(b) by 597 days.

(21) Appl. No.: 10/588,708

(22) PCT Filed: Mar. 15, 2005

(86) PCT No.: PCT/JP2005/004543

§ 371 (c)(1),
(2), (4) Date: Aug. 9, 2006

(87) PCT Pub. No.: WO2005/093854

PCT Pub. Date: Oct. 6, 2005

(65) Prior Publication Data

US 2007/0169805 A1  Jul. 26, 2007

(30) Foreign Application Priority Data

Mar. 25, 2004 (JP) .............................. 2004-089817

(51) Int. Cl.
*H01L 25/00* (2006.01)
(52) U.S. Cl. .................................................... 136/243
(58) Field of Classification Search .................. None
See application file for complete search history.

(56) References Cited

U.S. PATENT DOCUMENTS

2003/0116185 A1* 6/2003 Oswald .................. 136/251
2005/0238871 A1* 10/2005 Robinson et al. .......... 428/331

FOREIGN PATENT DOCUMENTS

| JP | 06-097475 | 4/1994 |
| JP | 11-135817 | 5/1999 |
| JP | 2000-183376 | 6/2000 |
| JP | 2000-252501 | 9/2000 |
| JP | 2001-015787 | 1/2001 |
| JP | 2001-257369 | 9/2001 |
| JP | 2002-141525 | 5/2002 |
| JP | 2003-243676 | 8/2003 |
| WO | WO 00/28603 | 5/2000 |

OTHER PUBLICATIONS

Matsui, et al., "Influence of substrate texture on microstructure and photovoltaic performances of thin film polycrystalline silicon solar cells" Journal of Non-Crystalline Solids 299-302 (2002) pp. 1152-1156.

* cited by examiner

*Primary Examiner*—Alexa D Neckel
*Assistant Examiner*—Shannon Gardner
(74) *Attorney, Agent, or Firm*—Hogan Lovells US LLP

(57) ABSTRACT

An inexpensive substrate for thin film solar cells having improved performance of a thin film solar cell, and a manufacturing method thereof are provided by increasing light trapping effect due to effective increase in unevenness of a substrate for thin film solar cells. Furthermore, a thin film solar cell having improved performance using the substrate is provided. A substrate for thin film solar cells of the present invention has a transparent insulating substrate and a transparent electrode layer deposited thereon including at least zinc oxide (ZnO), the transparent insulating substrate has a fine surface unevenness having a root-mean-square deviation of the surface (RMS) 5 to 50 nm in an interface by a side of the transparent electrode layer, a projected area thereof consists of a curved surface, and furthermore a haze ratio or a ratio of a diffuse transmittance to a total transmittance as an index of unevenness of a substrate may be set at not less than 20% measured using a C light source. And thereby light trapping effect may effectively occur to improve performance of the thin film solar cell.

9 Claims, 8 Drawing Sheets

US 7,781,668 B2

SUBSTRATE FOR THIN-FILM SOLAR CELL, METHOD FOR PRODUCING THE SAME, AND THIN-FILM SOLAR CELL EMPLOYING IT

CROSS-REFERENCE TO THE RELATED APPLICATIONS

This application is a national stage of PCT application No. PCT/JP2005/004543 filed Mar. 15, 2005, the entire contents of which are incorporated by reference. This application also claims benefit of priority under 35 U.S.C. §119 to Japanese Patent Application No. 2004-089817 filed Mar. 25, 2004, the entire contents of which are incorporated by reference.

TECHNICAL FIELD

The present invention relates to a substrate for thin film solar cells, a method for manufacturing the same, and thin film solar cells therewith.

BACKGROUND ART

In recent years, for coexistence of cost reduction and higher efficiency of solar cells, thin film solar cells consuming only a small amount of raw materials attract attention, and wholehearted development is now being performed. Especially, expected is, as a method for enabling cost reduction, a method for forming an excellent semiconductor layer on an inexpensive transparent base material, such as glass, using a low-temperature process.

When such a thin film solar cell is manufactured as a thin film solar cell having a large area enabling generation of electric power with a high output at a high voltage, generally used is a method wherein a plurality of thin film solar cells formed on a substrate with a large area connected in series are not used, but in order to obtain excellent yield, a thin film solar cell formed on the substrate with a large area is divided into a plurality of cells, and the cells are then connected in series to realize integration. In a thin film solar cell, using a glass plate as a substrate, especially having a configuration wherein light is entered from a glass substrate side, generally after sequential formation of semiconductor layers on a glass substrate, isolation grooves are applied by processing the transparent electrode in a shape of strips with a specified width, using a laser scribe method, in order to reduce a loss by a resistance of a transparent electrode layer on the glass substrate, and then each cell is connected in series in a direction perpendicular to a longitudinal direction of the strips to realize integration.

FIG. 2 is a conceptual plan view of such an integrated type thin film solar cell.

FIG. 3 is a sectional view of a structure of an area surrounded with an ellipse 2A in FIG. 2.

FIG. 4 is a more detailed sectional 3.

view of a stacked structure of an area surrounded with an ellipse 3A in Figure

Generally in manufacture of an integrated type thin film solar cell 6 as shown in FIGS. 2 to 4, a glass substrate 11 is used as a transparent insulating substrate 11. On the glass substrate 11, a $SnO_2$ film having a thickness of 700 nm, for example, is formed by a heat CVD method as a transparent electrode layer 12. The transparent electrode layer 12 is isolated into transparent electrodes with strip-shape having a width W of approximately 10 mm by forming a transparent electrode layer isolation groove 62 having a width of about 100 micrometers with a laser scribe method. Residues after scribed are removed by ultrasonic cleaning using organic solvents or water. As cleaning methods, methods of removing residues using pressure sensitive adhesives, injection gases, etc. may also be used.

Furthermore, after formation of one or more of amorphous units 2 or crystalline photoelectric conversion units 3, these units are divided within a plane thereof into a plurality of areas with strip-shape with connection groove 63. Since, this connection groove 63 is used for electrical connection of the transparent electrode layer 12 and the back face electrode layer 4, between mutually adjacent cells, partial remaining of residue of the scribe do not occur problems, and therefore ultrasonic cleaning may be omitted. Then, formation of a back face electrode layer 4 electrically connects the back face electrode layer 4 to the transparent electrode layer 12 formed in a shape of a strip as mentioned above via the connection groove 63.

The back face electrode layer 4 is formed in a manner that it is patterned by a same laser scribe method as in the one or more crystalline photoelectric conversion units 3 or amorphous unit 2, then is locally blown away with one or more crystalline photoelectric conversion unit 3 or amorphous units 2 to form a plurality of back electrode isolation grooves 64, and then ultrasonic cleaning is given. This method enables formation of solar cells 61 having a shape of a plurality of strips, and realizes mutual electric series connection through the connection groove 63 of those cells. Finally, a back face side of the thin film solar cell is protected by additional sealing resin (not shown).

In thin film solar cells, although they may have thinner photoelectric conversion layers as compared with layers in solar cells using conventional bulk type monocrystalline or polycrystalline silicon, they have a problem that light absorption of a whole thin film will be limited by a film thickness. Then, in order to more effectively utilize light that entered into a photoelectric conversion unit including a photoelectric conversion layer, proposed are designing ideas for increasing an amount of light absorption within the photoelectric conversion layer. In the technique, unevenness is given to a surface of transparent conducting layer or a metal layer in contact with the photoelectric conversion unit (texturizing) to scatter the light in an interface of the surface, and then to enter the light into the photoelectric conversion unit. This technique is referred to as "light trapping", and is important elemental technology for practical use of thin film solar cells having high photoelectric conversion efficiency.

Amorphous silicon cells as an example of thin film solar cells are usually formed on a transparent base material, such as glass, and use tin oxide ($SnO_2$) film having surface unevenness thereon as a transparent electrode layer. Surface unevenness of this transparent electrode layer effectively contributes to light trapping within the photoelectric conversion layer. However, a glass base material having $SnO_2$ film formed by a thermal chemical vapor deposition method (thermal CVD method) as a transparent electrode layer having a surface unevenness effective in light trapping has a problem of necessity of a high temperature process at approximately 550 to 650 degree C. in order to form the transparent electrode layer, leading to a problem of high manufacturing cost. High filmforming temperatures lead to a problem of disabling use of inexpensive base materials, such as glass and plastic film, after solidification. Exposure to high temperature processes of tempered glass reduces tempered effect, and disables use as a base material of the tempered glass, therefore use of thicker glass is needed in order to secure a strength of the glass base material in application in large area solar cells, resulting in heavier products.

Moreover, the SnO$_2$ film has low plasma-proof property, and therefore reduction of SnO$_2$ film may be induced under environment of deposition of a photoelectric conversion layer with a greater electron density using hydrogen. A reduced SnO$_2$ film blackens, therefore blackened portions of the transparent electrode layer absorbs incident light, and decreases an amount of the transmitted light into the photoelectric conversion layer, causing decrease in conversion efficiency.

Additionally, amorphous silicon cells have lower initial photoelectric conversion efficiency as compared with monocrystal or polycrystal solar cells, and moreover have a problem of decrease in conversion efficiency due to photodegradation phenomenon. Therefore, crystalline silicon thin film solar cells using crystalline silicon like thin film polycrystalline silicon or micro crystallite silicon as a photoelectric conversion layer is expected and investigated as a device enabling coexistence of low cost and high efficiency. Reasons are that crystalline silicon thin film solar cells may be formed at lower temperatures by a plasma CVD method in a same manner as in formation of amorphous silicon, and furthermore may be formed almost without photodegradation phenomenon. Although amorphous silicon photoelectric conversion layers can perform photoelectric conversion of light in wavelengths of approximately 800 nm in a longer wavelength side, crystalline silicon photoelectric conversion layers can perform photoelectric conversion of light in longer wavelengths up to approximately 1200 nm. However, it needs a larger plasma density than a density in deposition conditions used for formation of amorphous silicon, and therefore in using SnO$_2$ film for transparent electrodes, greater improvement in conversion efficiency has been difficult.

Terms of "crystalline" and "micro crystallite" as used in the present specification also include a state where amorphous material is partially included.

On the other hand, zinc oxide (ZnO) has advantageously higher plasma resistance than that of SnO$_2$ or indium oxide tin (ITO) widely used as materials of transparent electrode layers, and furthermore it has lower price, and therefore, it is preferable as a transparent electrode layer material for thin film solar cells.

(Prior Art 1)

For example, Japanese Patent Laid-Open No. 2000-252501 official report discloses a formation method of ZnO film wherein a thin film having unevenness may be formed by a low pressure thermal CVD method (also referred to as MOCVD method) at temperatures not more than 200 degrees C. Since the method is a low-temperature process at temperatures not more than 200 degrees C., it can achieve lower cost compared with that of the high pressure thermal CVD. The method can use inexpensive base materials, such as glass and plastics films after solidification. Use of tempered glass may provide large area solar cell glass base materials having smaller thickness of approximately ⅔ than that in conventional method, resulting in lighter substrates. Furthermore, the low pressure thermal CVD method enables film formation faster by an order of magnitude than that in sputtering technique, and higher effective utilization efficiency of raw materials, and therefore the method is preferable for thin film solar cells also in respect of manufacturing cost.

(Prior Art 2)

On the other hand, Japanese Patent Laid-Open No. 2003-243676 official report indicates a technique of forming transparent electrode layers, wherein in order to give unevenness to a substrate for thin film solar cells, a foundation layer having unevenness is formed on a surface of a glass base material, and then a transparent electrode layer is formed thereon, instead of forming unevenness on the transparent electrode layer itself. In the method, formed on a glass base material is a foundation layer having unevenness comprising insulating micro-particles having an average particle diameter of 0.1 to 1.0 micrometers and binder, subsequently on which a transparent electrode layer is deposited. Thereby, since fine unevenness is formed on the glass substrate by the micro-particles, the transparent electrode layer in particular itself does not necessarily have formed unevenness thereon.

SUMMARY OF THE INVENTION

An object of the present invention is to effectively increase unevenness of a substrate for thin film solar cells, and to acquire efficient light trapping effect, to provide inexpensive substrates for thin film solar cells enabling improvement in performance of the thin film solar cells, and a manufacturing method thereof. And another object of the present invention is to provide thin film solar cells having improved performance using the substrate.

First, as shown in FIG. 1, in the case where ZnO is formed on a base material without foundation layer as in prior art 1, it is difficult to make a haze ratio higher, for example, up to not less than 20%, resulting in failure of obtaining effective "light trapping." Since film-formation of a transparent electrode layer at base material temperatures of not less than 150 degrees C. reduces a haze ratio especially when not using foundation layer, the conventional method of prior art 1 leads to a problem of decrease in a short circuit current density of the thin film solar cell.

In silicon based thin film solar cells, thin film silicon semiconductor layers of crystalline silicon or amorphous silicon is generally formed using a plasma CVD method, at base material temperatures of 180 to 300 degrees C. In this case, a formation temperature of the silicon based semiconductor layer is higher than a formation temperature of the transparent electrode layer. Generally, a larger difference between a formation temperature of the transparent electrode layer and that of the silicon based semiconductor layer tends to give more serious heat damage to the transparent electrode layer. Therefore, the technique of prior art 1 has problems of decrease in properties of the thin film solar cell, and in long-term reliability.

The present inventors found out that in integrated type thin film solar cells including a crystalline photoelectric conversion layer like prior art 1, when a transparent electrode 102 formed at a low temperature is used, peeling of the films in many areas near the isolation groove easily occurs in ultrasonic cleaning after formation by a laser scribe method of a back electrode isolation groove 105. In peeling phenomenon of the film, the area of peeling increases as an area of the thin film solar cell becomes larger. Moreover, film peeling may already be observed after the scribe process. And naturally occurrence of such film peeling causes performance decrement of the resulting thin film solar cell.

When a haze ratio is intended to be higher, for example, not less than 20% in the method of prior art 2, a foundation layer having a large unevenness will be needed and as a result it will be necessary to enlarge a particle diameter of insulating micro-particles. Thus, use of larger insulating micro-particles gives uneven dispersion of the insulating micro-particles on the surface of the substrate, for example, forms areas lacking in micro-particles, and as a result, decreases an average conversion efficiency in thin film photoelectric conversion as the whole substrate, leading to a problem of color unevenness caused by an in-plane haze ratio distribution. Additionally it became clear that when intending to form larger unevenness using larger insulating micro-particles, adhesion with a binder between the micro-particles and the substrate becomes inadequate, resulting in a possibility of decrease in reliability of the thin film solar cell itself.

The present invention is made in view of such problems, and aims at providing a substrate for thin film solar cells having high power generation efficiency, a method for manufacturing the same, and a thin film solar cell using the same. Moreover, the present invention also aims at providing a substrate for a thin film solar cells enabling maintenance of a high power generation efficiency of an integrated type thin film solar cells, and easier integration thereof in the integrated type thin film solar cells having a large area, while enabling improvement of production yield.

As a result of wholehearted examination in order to form sufficient unevenness with transparent electrode layer itself in view of solving the problems, it was surprisingly found out by the present inventors that formation of a foundation layer having a small particle diameter may enable deposition of a transparent electrode layer having a larger unevenness thereon, although unevenness of the foundation layer itself is small, leading to completion of the present invention.

In order to solve the above-mentioned problems, a substrate for thin film solar cells of the present invention has a transparent insulating substrate, and a transparent electrode layer including at least zinc oxide (ZnO) deposited thereon, the transparent insulating substrate has a fine surface unevenness having a root-mean-square deviation of the surface (RMS) of 5 to 50 nm in an interface on a side of the transparent electrode layer, and the projected area consists of a curved surface.

Particularly, in the case where the transparent electrode layer has a film thickness of not less than 1 micrometers, use of the above-mentioned transparent insulating substrate clearly demonstrates effect of controlling peeling of a film from the transparent insulating substrate induced by an internal stress in the thick transparent electrode layer.

Formation of the transparent electrode layer on the transparent insulating substrate having the fine surface unevenness provides a substrate for a thin film solar cells of the present invention with not less than 20% of haze ratio or a ratio of a diffuse transmittance to a total transmittance, as an index of unevenness of a substrate, that is measured using a C light source, and can effectively demonstrate light trapping, leading to improvement in performance of the thin film solar cell.

Furthermore, when the above-mentioned transparent insulating substrate comprises a transparent base material mainly having a smooth surface, such as glass, the fine unevenness on a side of the transparent electrode layer is preferably formed with a transparent foundation layer including micro-particles at least comprising silicon oxides having a particle diameter of not less than 10 nm and less than 100 nm. In addition, the transparent foundation layer is preferably a film covering the micro-particles with a metal oxide in view of adhesive strength with transparent insulating substrate.

An integrated type thin film solar cell of the present invention is isolated with a plurality of isolation grooves so as to form a plurality of photoelectric conversion cells provided with at least one crystalline photoelectric conversion unit layer on the substrate for thin film solar cells, the cells are electrically connected in series with each other via a groove for connection, and a crystalline photoelectric conversion layer included in the crystalline photoelectric conversion unit layer is deposited to give a thickness of not less than 1 micrometer.

The substrate for the thin film solar cells of the present invention may be manufactured by depositing on a transparent base material a transparent foundation layer having surface unevenness and a transparent electrode layer at least including zinc oxide in this order, at temperatures of the transparent insulating substrate of not less than 150 degrees C. using a low pressure thermal CVD method.

BEST MODE FOR CARRYING-OUT OF THE INVENTION

Focusing on a transparent electrode layer by a low pressure thermal CVD method, the present inventors carried out wholehearted investigation on a substrate for thin film solar cells. As a result, the present inventors found out that in a transparent electrode layer using the low pressure thermal CVD method, existence of a foundation layer varies unevenness of a substrate for thin film solar cells, particularly, existence of a foundation layer greatly varies dependency over temperatures of a base material of an unevenness of a substrate for thin film solar cells.

In the present invention, a haze ratio is mainly used as a performance index of an unevenness of a substrate for thin film solar cells. A haze ratio is represented by a value of (diffuse transmittance/whole light transmittance)×100[%] (JIS K 7136).

FIG. 1 shows a first embodiment of the present invention, and shows a haze ratio of a substrate 1 for thin film solar cells shown in FIG. 5 with respect to a base material temperature when forming zinc oxide (ZnO) by a low pressure thermal CVD as a transparent electrode layer 12. In the substrate 1 for thin film solar cells, as a transparent insulating substrate 11, a silicon oxide including silica micro-particles 1121 as transparent micro-particles 1121 is formed, as a transparent foundation layer 112 having unevenness, on a glass plate 111 as a transparent base material 111. A film of the transparent electrode layer 12 may be formed by the low pressure thermal CVD method, using a mixed gas of diethyl zinc (DEZ), water, diborane ($B_2H_6$), hydrogen, and argon as a source gas. A film thickness of the transparent electrode layer 12 formed in FIG. 1 is constant at about 1.5 micrometers. A haze ratio of a transparent insulating substrate 11 having only a transparent foundation layer 112 formed on a glass plate 111 gave a value of not more than 0.7%, hardly demonstrating optical scattering effect.

On one hand, as FIG. 1 shows clearly, without any transparent foundation layer 112, a haze ratio rapidly increases in an area giving not less than 140 degrees C. of temperatures of the transparent insulating substrate 11 during deposition of the zinc oxide layer 12, gives a greatest value at 150 degrees C., and then drops conversely at temperatures not less than the temperature. On the other hand, although with the transparent foundation layer 112, a haze ratio rapidly increases in an area having not less than 140 degrees C. of temperatures of the transparent insulating substrate 11 during deposition of the zinc oxide layer 12 in a same manner as a case without any transparent foundation layer 112, a haze ratio continues increasing even in an area of not less than 150 degrees C. With low temperatures of the transparent insulating substrate 11 during deposition of the zinc oxide layer 12, a difference of the haze ratios by existence of the transparent foundation layer 112 is almost constant at 4 to 6%. However, at above 150 degrees C., a difference of the haze ratios by existence of the transparent foundation layer 112 becomes remarkably larger with increase in temperature. This reveals that when a temperature of the transparent insulating substrate 11 is not less than 150 degrees C., existence of the transparent foundation layer 112 having unevenness changes mode of the film growth in deposition of the zinc oxide (ZnO) 12 by the low pressure thermal CVD method. When a temperature of the transparent insulating substrate 11 during deposition of the zinc oxide layer 12 is not less than 150 degrees C., more promoted growth of ZnO probably increases a haze ratio in a projected area of the transparent foundation layer 112.

This result clearly shows that even when a film thickness of the transparent electrode layer 12 is constant, a haze ratio may sharply be increased. Moreover, even a comparatively smaller thin film thickness of ZnO of 1.5 micrometers may provide a high haze ratio of not less than 20%, which might not be obtained without any transparent foundation layer 11.

With the transparent foundation layer 112, since a problem of decline in a haze ratio is not caused at temperatures of not less than 150 degrees C. of the transparent insulating substrate 11 during deposition of zinc oxide layer 12, temperatures during film-forming of the transparent electrode layer 12 may be set higher as compared with a case where no transparent foundation layer 112 is used. Therefore, influence of heat damage at the time of film-forming of one or more amorphous units 2 or crystalline photoelectric conversion units 3 deposited by a plasma CVD method etc. on the transparent electrode layer 12 may be reduced, and thus improvement in performance of the thin film solar cell 5 and improvement in reliability for a long period of time may be expected.

FIG. 5 shows a typical sectional view of a substrate 1 for thin film solar cells of the present invention. In a substrate 1 for thin film solar cells of the present invention, a transparent electrode layer 12 is deposited on a transparent insulating substrate 11 having a transparent foundation layer 112 formed on a transparent base material 111.

In the transparent insulating substrate 11, the transparent foundation layer 112 is formed on the transparent base material 111.

The transparent insulating substrate 11 is disposed in light incident side when a thin film solar cell 5 is formed, and preferably is as transparent as possible in order to make more amount of sunlight transmitted and absorbed by the photoelectric conversion unit of the amorphous or crystalline. Glass plates, transparent plastic films, etc. are used as materials. Based on a same intention, a non reflective coating is preferably given to a plane of incidence of light of the transparent base material 111 so as to reduce a loss of light reflex in a plane of incidence of sunlight.

In order to promote growth of unevenness of the ZnO layer 12, a fine surface unevenness is preferably given to the transparent foundation layer 112. Growth of ZnO is more promoted to enlarge unevenness of the ZnO in growth of ZnO in a projected area of foundation layer 2, resulting in haze ratio improvement. A root-mean-square deviation of the surface (RMS) of the fine surface unevenness formed by the transparent foundation layer 112 is preferably not less than 5 nm. A reason is that excessively small RMS may give a shape close to a smooth surface, and therefore a difference of the growth of ZnO by a surface fine unevenness may hardly be demonstrated.

A projected area of the fine unevenness formed in the transparent foundation layer 112 preferably comprises a curved surface. A projected area having a curved surface probably suppresses increase in a grain boundary having a shape of the transparent foundation layer 112 as a starting point, leading to suppression of decline of electrical properties of the resulting thin film solar cell 5.

FIG. 6 shows a typical sectional view of a thin film solar cell 5 according to an embodiment of the present invention. The thin film solar cell 5 includes a transparent foundation layer 112, a transparent electrode layer 12, a crystalline photoelectric conversion unit layer 3, and a back face electrode layer 4 on a transparent base material 111 deposited sequentially. And the crystalline photoelectric conversion unit layer 3 includes one conductivity type layer 31, a crystalline photoelectric conversion layer 32 made of substantially intrinsic semiconductor and a reverse conductivity type layer 33 deposited sequentially. Sunlight (hv) subjected to photoelectric conversion enters from a transparent insulating base material 111 side.

The transparent insulating substrate 11 is constituted by a transparent base material 111 and the transparent foundation layer 112 in the thin film solar cell 5 of FIG. 6, and it may be constituted by a simple substance, or it should just have a fine unevenness of a projected area having a curved surface in the transparent electrode layer 12 side of the transparent insulating substrate 11. The transparent electrode layer 12 is further formed on this transparent insulating substrate 11, and thus a substrate 1 for thin film solar cells is obtained. However, since general-purpose glass plates and films used as a transparent insulating substrate 11 usually have a smooth surface, it is difficult to obtain a surface having uniformly fine unevenness using a grinding method, resulting in difficulty of obtaining of cells with large-area. Therefore, in the transparent insulating substrate 11 provided with fine surface unevenness having peeling preventive effect of the present invention, the transparent foundation layer 112 is preferably formed on the transparent base material 111 having a smooth surface, and the fine surface unevenness is preferably given by the transparent foundation layer 112. An RMS of the fine surface unevenness formed by the transparent foundation layer 112 is preferably 5 to 50 nm, and more preferably 10 to 40 nm. Reasons are that since an excessively small RMS has a shape close to a smooth surface, sufficient improving effect of adhesive properties with surface fine unevenness may not be acquired, and that an excessively large RMS causes formation of electric and mechanical defects in the thin film solar cell 5 formed thereon, leading to deterioration in photoelectric conversion efficiency of the solar cell.

A projected area of the fine unevenness formed in the transparent foundation layer 11 preferably comprises a curved surface. A projected area having a curved surface suppresses increase in a grain boundary having a shape of the transparent foundation layer 112 as a starting point, in case of crystal growth of thin films deposited sequentially thereon, leading to suppression of decline of electrical properties of the resulting thin film.

The translucent foundation layer 112 formed in the present invention preferably includes translucent micro-particles 1121. The translucent micro-particles 1121 form unevenness in the translucent foundation layer 112, and can vary growth of a film of the transparent electrode layer 12 deposited thereon, as compared with the case of not using translucent foundation layer 112.

Examples of the transparent foundation layer 112 formed in the present invention include a layer including microparticles at least comprising silicon dioxide ($SiO_2$) as transparent micro-particles 1121. It is because $SiO_2$ has a refractive index lower than that of the transparent electrically conductive layer 12, and this value is close to that of the transparent base materials 111, such as glass plate. Since $SiO_2$ has high transparency, it is preferable as a material used in a light incident side. Furthermore, as materials of the transparent micro-particle 1121 added to $SiO_2$ in order to adjust refractive index of the transparent foundation layer 112, may be used are, for example, silica ($SiO_2$), titanium dioxide ($TiO_2$), aluminum oxide ($Al_2O_3$), zirconium oxide ($ZrO_2$), indium oxide tin (ITO), or magnesium fluoride ($MgF_2$) etc.

and these materials have refractive indexes close to that of glass. Values of refractive index are preferably 1.4 to 2.5.

Especially in respect of transparency of the material, or affinity with glass plate, silica micro-particles are preferable. In order to obtain 5 to 50 nm of a root-mean-square deviation of the surface of surface unevenness in the transparent foundation layer 112, a particle diameter of the micro-particles to be used is preferably not less than 10 and less than 100 nm. In order to uniformly form the finest possible unevenness, the micro-particles have preferably a spherical shape.

Methods for forming the transparent foundation layer 112 including the transparent micro-particle 1121 on a surface of the transparent base material 111 is not especially limited, and preferable is a method of forming a transparent binder 1122 between the transparent micro-particles 1121 by applying with the binder forming material including a solvent. Since transparent binder 1122 playing a role of improving a bond strength between the transparent micro-particles 1121 and between the transparent micro-particles 1121 and the transparent base material 111 functions as an adhesive layer, inorganic materials are preferable in view of reliability over a long period of time and durability with respect to photoelectric conversion layer formation conditions (especially temperature). Specifically, metal oxides, such as silicon oxides, aluminum oxide, titanium oxides, zirconium oxide, and tantalum oxide, may be mentioned. When making especially $SiO_2$ micro-particles 1121 adhere to the glass plate 111, use, as the translucency binder 1122 as adhesive layer, of silicon oxides having a same silicon as main components may form silicide bonds to give firm adhesion, and moreover advantageously may demonstrate excellent transparency, and gives a refractive index close to that of the substrate or the micro-particles.

As mentioned above, the transparent foundation layer 112 does not need to be made of a same material as that of the transparent electrode layer 12 mentioned later. Moreover, the transparent foundation layer 112 does not need to be of a crystal phase, and all of the layer may be of an amorphous phase. For example, when the transparent foundation layer 112 is formed with $SiO_2$ micro-particles as the transparent micro-particles 1121, and silicon oxide as the transparent binder 1122, the resulting transparent foundation layer 112 is usually of amorphous.

As methods for applying the above-mentioned coating liquid onto a surface of the transparent base material 111, a dipping method, a spin coating method, a bar coating method, a spray method, a die coat method, a roll coating method, a flow coat method, etc. may be mentioned. For densely and uniformly forming the transparent micro-particles 1121, a roll coating method is suitably used. Immediately after completion of application, the coated thin film will be heated and dried. Thus firmed transparent foundation layer 112 film includes micro-particles, and therefore has a projected area with curved surface and comparatively uniform height of the unevenness. Accordingly, the film gives little defects to the transparent electrode layer 12 and furthermore to the thin film photoelectric conversion unit to be formed later.

In addition, when soda lime glass plate is used as the transparent base material 111, in order to prevent alkali component from the glass material migrating into the transparent electrode layer 12 or the photoelectric conversion unit, the transparent foundation layer 112 may also be utilized as an alkali barrier film.

In addition, since the substrate 1 for thin film solar cells having the transparent electrode layer 12 formed thereon is a stacked layer of transparent thin films, the substrate tends to give uneven coloring by interference of light. In order to prevent the uneven coloring, a plurality of thin films having different refractive indexes may be intervened in combination between the transparent foundation layer 2 and the transparent electrode layer 102.

As a material of the transparent electrode layer 12, preferably used is a transparent conductive oxidized film at least including ZnO that has been formed by a low pressure thermal CVD method. It is because that since ZnO is a material that can form a textured structure having light trapping effect even at low temperatures of not more than 200 degrees C., has high plasma resistance, and is suitable for the thin film solar cell 5 having the crystalline photoelectric conversion unit 3. For example, the ZnO transparent electrode layer 12 of the substrate for thin film solar cells of the present invention is formed on conditions that: a base material temperature, that is, a temperature of the transparent insulating substrate 11 as a foundation layer of not less than 150 degrees C.; pressure of 5 to 1000 Pa; and diethyl zinc (DEZ), water, doping gas, and diluting gas as a source gas. In addition to the materials as a zinc source gas, dimethyl zinc may also be used. As source gas of oxygen, may also be used: oxygen, carbon dioxide, carbon monoxide, dinitrogen oxide, nitrogen dioxide, sulfur dioxide, dinitrogen pentaoxide, alcohols (R(OH)), ketones (R(CO)R'), ethers (ROR'), aldehydes (R(COH)), amides ($(RCO)_x(NH_{3-x})$, x=1, 2, 3), and sulfoxides (R(SO)R') (wherein, R and R'=alkyl group). As diluting gases, rare gas (He, Ar, Xe, Kr, Rn), nitrogen, hydrogen, etc. may be used. As doping gases, diborane ($B_2H_6$), alkyl aluminums, alkyl galliums, etc. may be used. A ratio of DEZ to water is preferably 1:1 to 1:5, and a ratio of $B_2H_6$ to DEZ is preferably not less than 0.05%. Since DEZ and water are liquids at normal temperature and at normal pressure, they are vaporized using methods, such as heating evaporation, bubbling, and spraying to be supplied. When a film thickness of ZnO is set at 0.5 to 3 micrometers, a thin film having surface unevenness with particle diameters of approximately 50 to 500 nm and with a height of unevenness of approximately 20 to 200 nm may be obtained, and this configuration is preferable in order to obtain light trapping effect of the thin film solar cell. A "base material temperature" as used herein means a temperature of a field where the transparent insulating substrate 11 is in contact with a heating part of a film-forming equipment.

When the transparent electrode layer 12 comprises a thin film having ZnO as a main component, an average thickness of the ZnO film is preferably 0.5 to 3 micrometers. Because, on one hand, an excessively thin ZnO film makes it difficult to fully provide unevenness that effectively contributes to light trapping effect, and to provide conductivity needed as a transparent electrode. And on the other hand, it is because that excessively thick ZnO film itself has light absorptive property, decreases an amount of light transmitting through ZnO and reaching onto the photoelectric conversion unit to deteriorate efficiency. Furthermore, an excessively thick film increases a film-forming cost due to increase in film-forming period.

In integrated type thin film solar cells, since based on a necessity that a plurality of areas corresponding to a plurality of solar cells 16 to be integrated needs to be isolated, this transparent electrode layer 12 has transparent electrode layer isolation grooves 62 formed by a laser scribe method. These transparent electrode layer isolation grooves 62 extend in a shape of a straight line in a direction perpendicularly intersecting with a page space of FIG. 3.

On the transparent electrode layer 12 having the transparent electrode layer isolation groove 62 formed therein, the crystalline photoelectric conversion unit 3 is formed.

FIG. 7 shows a typical sectional view of a thin film solar cell 5 by one embodiment of the present invention. The crystalline photoelectric conversion unit 3 and the back face electrode layer 4 are formed in this order on the substrate 1 for thin film solar cells shown in FIG. 5.

The crystalline photoelectric conversion unit 3 includes one conductivity type layer 31, crystalline intrinsic photoelectric conversion layer 32, and reverse conductivity type layer 33. FIG. 7 shows a thin film solar cell 5 having only one crystalline photoelectric conversion unit 3 exists therein, but the thin film solar cell 5 may have a plurality of photoelectric conversion units having different characters stacked thereon. As crystalline photoelectric conversion unit 3, units having absorption in a dominant wavelength region (400 to 1200 nm) of sunlight is preferable, and for example, a crystalline silicon based photoelectric conversion unit 3 using a crystalline silicon based thin film as a crystalline intrinsic photoelectric conversion layer 32 may be adopted. In addition to silicon, "silicon based" material also includes silicon alloy semiconductor materials including silicon, such as silicon carbide and silicon germanium.

The crystalline silicon based photoelectric conversion unit 3 is, for example, formed by stacking each semiconductor layer in a order of a "pin type" using a plasma CVD method. In detail, for example, a p type micro crystallite silicon based layer wherein not less than 0.01 atomic % of boron as impurity atom for determining a conductivity type is doped is stacked as one conductivity type layer 31, and then an intrinsic crystalline silicon layer 32 forming a photoelectric conversion layer, and an n type micro crystallite silicon based layer wherein not less than 0.01 atomic % of phosphorus as impurity atom for determining a conductivity type is doped may be deposited in this order as a reverse conductivity type layer 33. However, each of the layers is not limited to the above-mentioned layers, and for example, an amorphous silicon based film may be used as a p type layer. Moreover, as a p type layer, alloy materials, such as amorphous or micro crystalline silicon carbide or silicon germanium, may be used. In addition, a film thickness of the conductivity type (p type, n type) micro crystalline silicon based layer is preferably not less than 3 nm and not more than 100 nm, and more preferably not less than 5 nm and not more than 50 nm.

The intrinsic crystalline silicon layer 42 as a crystalline intrinsic photoelectric conversion layer 32 is preferably formed at base material temperatures of not more than 300 degrees C. by a plasma CVD method. It is preferable to include a large amount of hydrogen atoms for termination of defects in grain boundary or grains, and for inactivating the defects by formation at low temperatures. Specifically a hydrogen content of this layer is preferably within a range of 1 to 30 atomic %.

This layer is preferably formed as a thin film of substantially intrinsic semiconductor having a density of impurity atom for determining a conductivity type of not more than $1 \times 10^{18}$ cm$^{-3}$. Moreover, many of the crystal grains included in the intrinsic crystalline silicon layer preferably extends and grows in a pillar-shape from a transparent electrode layer 12 side, and preferably has a preferred orientation plane (110) with respect to the film surface. A film thickness of this intrinsic crystalline silicon layer is preferably not less than 1 micrometers from a viewpoint of light absorption, and also preferably not more than 10 micrometers from a viewpoint of suppressing peeling caused by internal stress of the crystalline. However, since a unit having absorption in a dominant wavelength region (400 to 1200 nm) of sunlight is preferable as a crystalline photoelectric conversion unit 3, a crystalline silicon carbide layer as an alloy material (for example, a crystalline silicon carbide layer comprising crystalline silicon including carbon of not more than 10 atomic %), or a crystalline silicon germanium layer (for example, a crystalline silicon germanium layer comprising crystalline silicon including germanium of not more than 30 atomic %) may be formed instead of the intrinsic crystalline silicon layer.

Thus stacked crystalline photoelectric conversion unit layer 3 is then divided into a plurality of strip-like semiconductor regions, in a same manner by connection grooves 63 as a semiconductor layer division grooves formed by a laser scribe method, as in case of the transparent electrode layer 12. These connection grooves 63 also extend in a shape of a straight line in a perpendicular direction to the page space of FIG. 3.

A back face electrode layer 4 is formed on one or more laser patterned photoelectric conversion units.

At least one material selected from Al, Ag, Au, Cu, Pt, and Cr is formed as at least one layer to give a metal thin film as a back face electrode layer 4 by a sputtering method of a vacuum deposition method. It is more desirable to form a conductive oxide layer, such as of ITO, SnO$_2$, and ZnO, as a part of the back face electrode layer 4 between the photoelectric conversion unit and the back face electrode layer 4. This conductive oxide layer raises light reflectivity of the back face electrode layer 4, and has a function to prevent chemical change of the photoelectric conversion unit, while increasing adhesive properties between the one or more photoelectric conversion units and the back face electrode layer 4.

The back face electrode layer 4 is patterned by a same laser scribe method as the method for one or more photoelectric conversion units, and the back face electrode layer 4 is locally blown away with the one or more photoelectric conversion units, thereby forming a plurality of back electrode layer isolation grooves 64. This method forms solar cells 61 of a shape of a plurality of strips, and provides mutual electrical series connection of these cells 61 via the grooves 63 for connection.

FIG. 8 shows a typical sectional view of a thin film solar cell 5 according to one embodiment of the present invention. This is a tandem type thin film solar cell having an amorphous photoelectric conversion unit 2 and a crystalline photoelectric conversion unit 3 stacked in an order on a substrate 1 for thin film solar cells. The amorphous photoelectric conversion unit 2 comprises a front one conductivity type layer, an intrinsic amorphous photoelectric conversion layer, and a front reverse conductivity type layer. Selection of an amorphous silicon based material as amorphous photoelectric conversion unit 2 provides sensitivity to light having wavelengths of approximately 360 to 800 nm, and selection of a crystalline silicon based material as a crystalline photoelectric conversion unit 3 provides sensitivity to light having longer wavelengths of up to approximately 1200 nm. Therefore, a thin film solar cell 5 having the amorphous silicon based photoelectric conversion unit 2 and the crystalline silicon based photoelectric conversion unit 3 stacked in this order from light incident side makes a thin film solar cell that can effectively be used in a wider range for incident light. The crystalline photoelectric conversion unit 3 is formed in a same manner as in the above-mentioned embodiment. In this case, the one or more photoelectric conversion unit portions formed on the transparent electrode layer 12 have a large whole film thickness leading to increase in internal stress. Therefore, a substrate 1 for thin film solar cells of the present invention is preferable also in a tandem thin film solar cell including such a crystalline photoelectric conversion unit 3.

The amorphous photoelectric conversion unit 2 is formed by stacking each semiconductor layer in a "pin type" order by a plasma CVD method, for example. In detail, for example, a p type amorphous silicon based layer having boron of not less than 0.01 atomic % doped as an impurity atom for determining a conductivity type, an intrinsic amorphous silicon based layer forming a photoelectric conversion layer, and an n type amorphous silicon based layer having phosphorus of not less than 0.01 atomic % doped as an impurity atom for determining a conductivity type may be deposited in this order. However, these layer are not limited to the above-mentioned layers, and for example, a micro crystalline silicon based film may be used as a p type layer. Moreover, as p type layers, alloy materials such as amorphous, or micro crystalline silicon carbide, silicon nitrides, silicon oxides, and silicon germanium, may be used. As intrinsic amorphous photoelectric conversion layers, alloy materials, such as silicon carbide and silicon germanium, may be used. In order to reduce defect density in a film and to reduce recombination current loss of a thin film solar cell, the intrinsic amorphous silicon based layer preferably includes hydrogen 2 to 15% in the film. In order to reduce degradation by optical irradiation, the intrinsic amorphous silicon based layer has a film thickness of not less than 50 nm, and not more than 500 nm. A micro crystalline silicon based film may be used as a n type layer. The conductivity type (p type, n type) micro crystalline silicon based layer or the amorphous silicon based layer preferably has a film thickness of not less than 3 nm and not more than 100 nm, and more preferably not less than 5 nm, and not more than 50 nm.

EXPLANATIONS OF LETTERS OR NUMERALS

Figure 1:
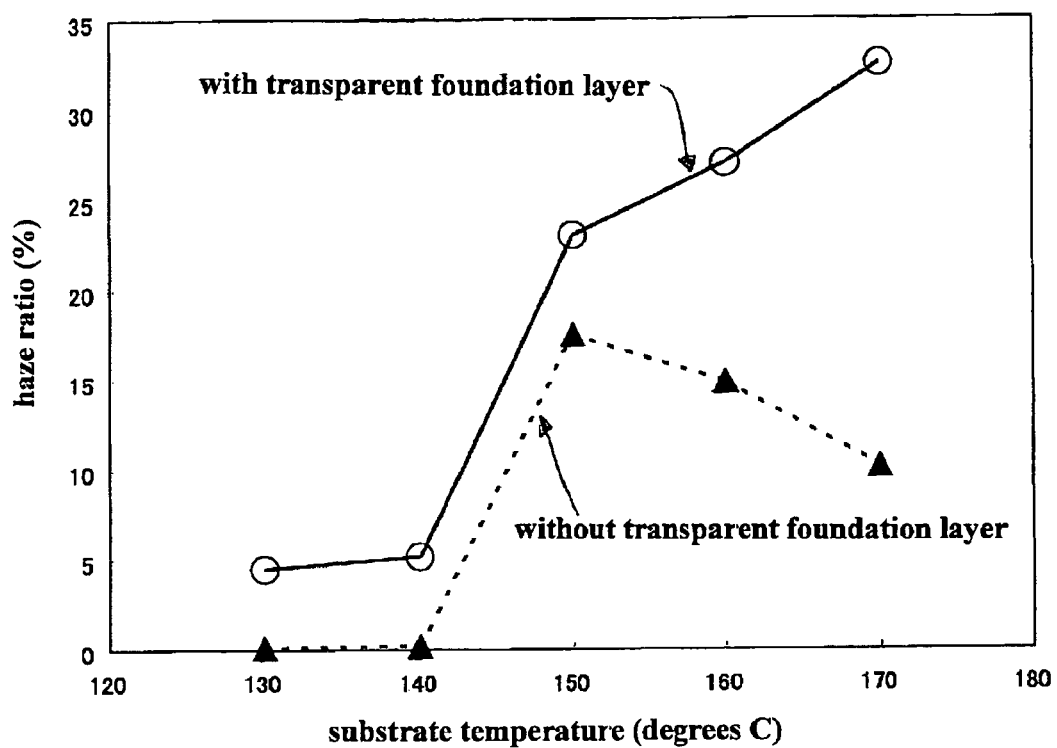
FIG. 1 shows a haze ratio of ZnO to temperatures of substrates formed by a low pressure thermal CVD method.
Figure 2:
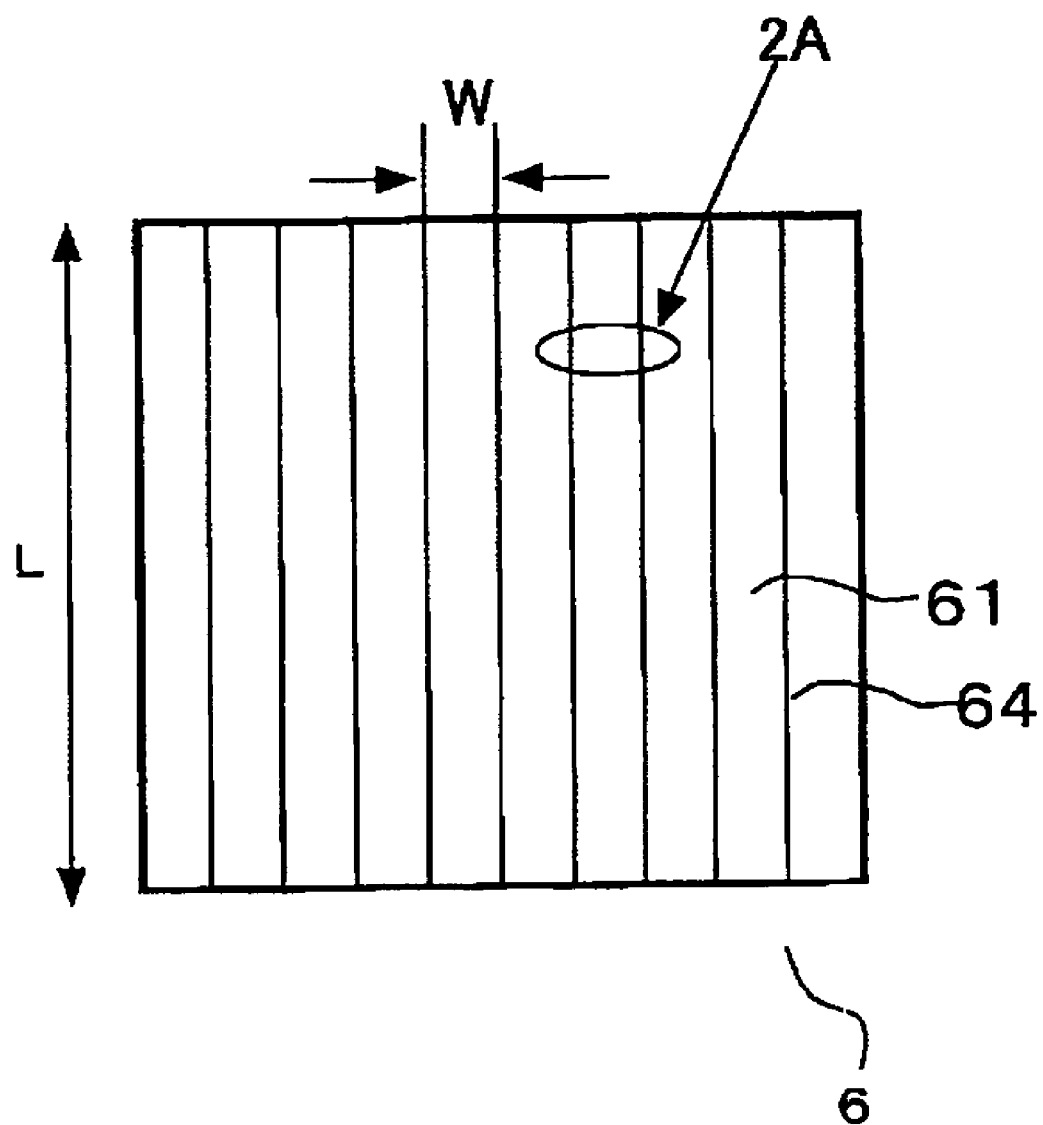
FIG. 2 shows schematic plan view showing an element plane of a typical example of an integrated type thin film solar cell.
Figure 3:
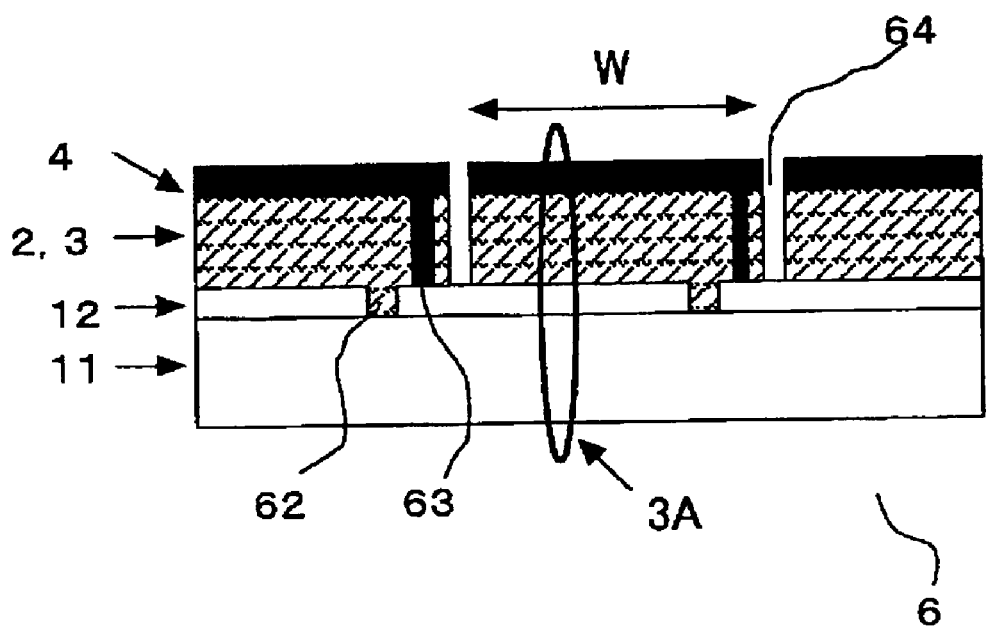
FIG. 3 shows a schematic sectional view showing an enlarged stacked structure in an area surrounded with an ellipse 2A in FIG. 2.
Figure 4:
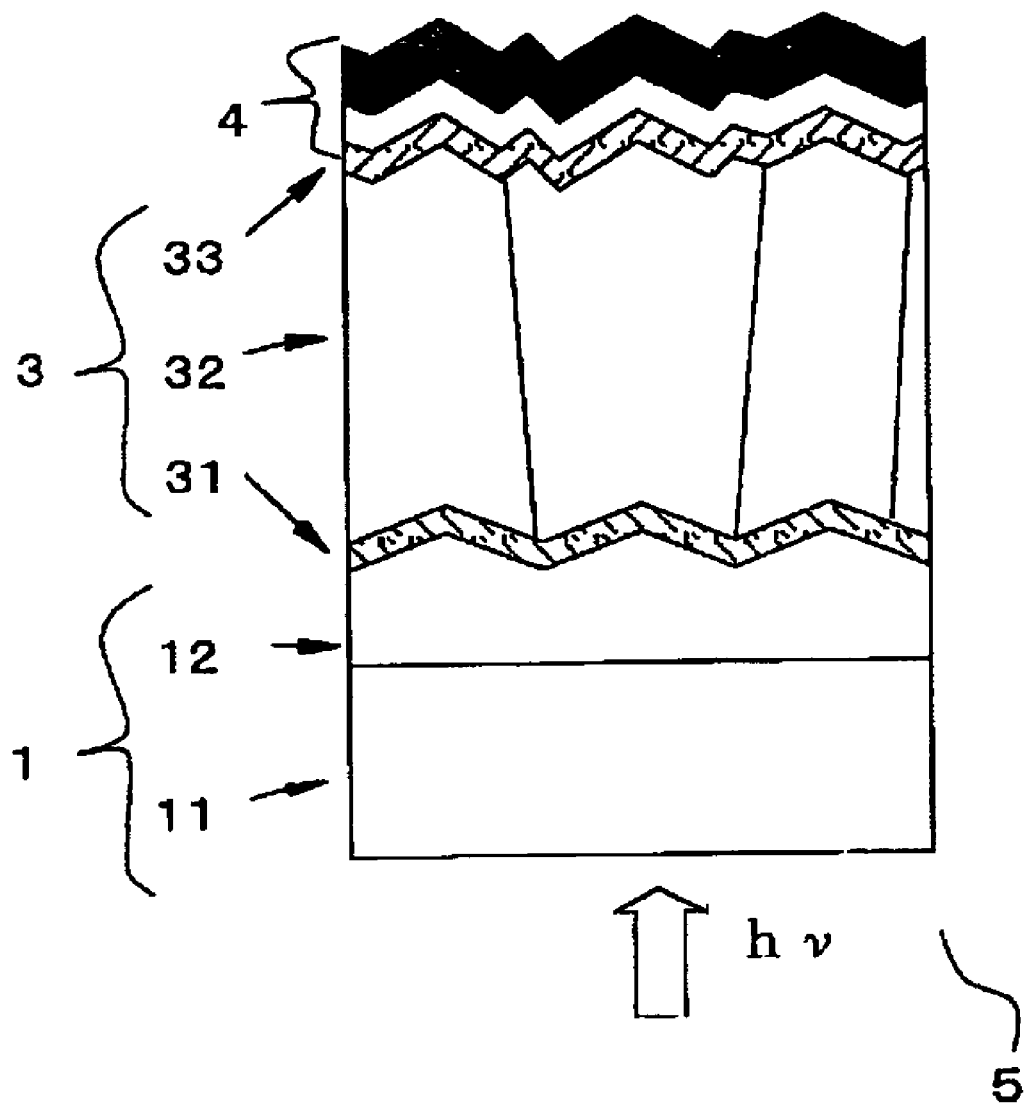
FIG. 4 shows a schematic and further enlarged sectional view of more detailed stacked structure of an area surrounded with an ellipse 3A in FIG. 3.

1 Substrate for thin film solar cells
11 Transparent insulating substrate
111 Transparent base material
112 Transparent foundation layers
1121 Transparent micro-particles
1122 Transparent binder
12 Transparent electrode layer
2 Amorphous photoelectric conversion unit
22 Amorphous intrinsic semiconductor layer
3 Crystalline photoelectric conversion unit
31 One conductivity type layer
32 Crystalline intrinsic semiconductor layer
33 Reverse conductivity type layer
4 Back face electrode layer
5 Thin film solar cell
6 Integrated type thin film solar cell
61 Solar cell
62 Transparent electrode layer isolation groove
63 Connection groove
64 Back face electrode layer isolation groove

EXAMPLE

Although detailed descriptions of the present invention will, hereinafter, be given with reference to Examples, the present invention is not limited to the following written examples, unless the spirit is exceeded.

Example 1

Figure 6:
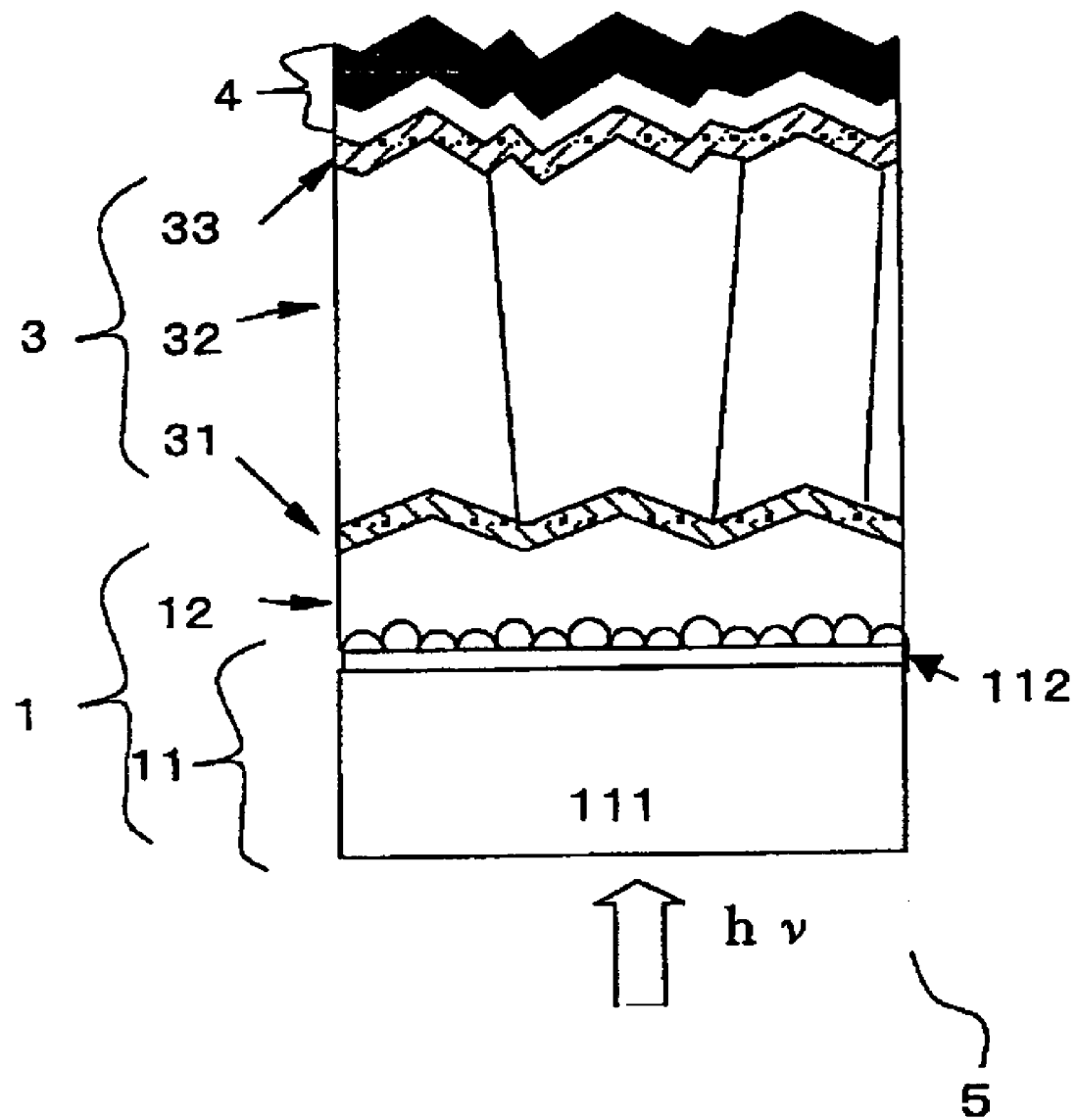
FIG. 6 shows a schematic sectional view wherein an example of a thin film solar cell as a third embodiment of the present invention is enlarged in an area surrounded with an ellipse 3A in FIG. 2.

A thin film solar cell 5 as shown in FIG. 6 was produced as Example 1.

A glass substrate of 0.7 mm in thickness and measuring 125 mm per side was used as a transparent base material 111, and a transparent foundation layer 112 including $SiO_2$ microparticles 1121 was formed on the glass substrate. A coating liquid used for forming a transparent foundation layer 112 was obtained in a manner that tetra-ethoxy silane was added to a mixed liquor of dispersion liquid of a spherical silica having a particle diameter of 50 nm, water, and ethyl cellosolve, and then hydrochloric acid was further added to hydrolyze the silica. After applying the coating liquid on the glass substrate 111 with a printing machine, the substrate was dried at 90 degrees C. for 30 minutes, and then heated at 350 degrees C. for 5 minutes to obtain a transparent insulating substrate 11 having fine unevenness formed on a surface thereof. When a surface of this transparent insulating substrate 11 was observed with an atomic force microscope (AFM), unevenness with a projected area comprising a curved surface influenced by a shape of the micro-particles was recognized.

The transparent foundation layer 112 formed on this condition gave an RMS of 7.2 nm. An RMS in the present invention was determined from an image by an atomic force microscope (AFM) obtained by observing an area of square measuring 5 micrometers per side (ISO 4287/1). Non contact mode of Nano-R system (made by Pacific Nanotechnology) was used for this AFM measurement.

A transparent electrode layer 12 comprising ZnO was formed on the obtained transparent foundation layer 112. This transparent electrode layer 12 was formed by a following CVD method wherein a base material temperature of the transparent insulating substrate 11 was set at 180 degrees C., diethyl zinc (DEZ) and water were supplied as a source gas, and diborane gas was supplied as a dopant gas, under a reduced pressure condition. A thickness of the obtained transparent electrode layer 12 comprising ZnO film gave 1.6 micrometers, a sheet resistance gave approximately 8 ohms/ □, and a haze ratio gave 20%. A haze ratio is represented by ((diffuse transmittance)/(whole light transmittance))×100 (JIS K7136). Thus obtained substrate 1 for thin film solar cells was measured for a whole light transmittance by entering light from a glass side using a spectrophotometer, giving a transmittance of not less than 80% in a range of a wavelength of 400 nm to 1200 nm.

The obtained transparent electrode layer 12 was isolated into transparent electrodes with strip-shape having a width W of approximately 10 mm and a length L of 10 cm, by forming a transparent electrode layer isolation groove 62 having a width of about 100 micrometers by a laser scribe method. Residues after scribing were removed by ultrasonic cleaning using water.

Onto this transparent electrode layer 12, formed sequentially was a crystalline silicon photoelectric conversion layer unit 3 consisting of a p type micro crystalline silicon layer 31 having a thickness of 15 nm, an intrinsic crystalline silicon photoelectric conversion layer 32 having a thickness of 1.5 micrometers, and an n type micro crystalline silicon layer 33 having a thickness of 15 nm by a plasma CVD method.

After formation of a connection groove 63 by a laser scribe method, an Al doped ZnO 121 having thickness of 90 nm and Ag 122 having a thickness of 200 nm were sequentially formed by a sputtering method as a back face electrode layer 4.

Although ultrasonic cleaning was given after laser scribe process of the back electrode layer isolation groove 64, a film peeling area on the substrate was not identified. A number of stages of the cell connected in series after integration gave 10 steps.

By irradiating light of AM1.5 with a quantity of light of 100 mW/cm$^2$, thus obtained integrated type silicon based thin film solar cell 6 was measured for an output characteristic. An open circuit voltage (Voc) per one step gave 0.547 V, a short circuit current density (Jsc) 23.1 mA/cm$^2$, a fill factor (F. F.) 72.8%, and a conversion efficiency 9.2%.

Example 2

Also in Example 2, an integrated type crystalline silicon based thin film solar cell 6 was produced in a same manner as in Example 1, except for having used a substrate having an area of 910 mm×455 mm and a thickness of 4 mm as a glass substrate 111. An RMS of the transparent foundation layer 112 thus formed on this condition gave 9.8 nm.

Although ultrasonic cleaning was given after laser scribe process of a back electrode layer isolation groove 64, a film peeling area on the substrate was not identified. A number of stages of the cell connected in series after integration gave 48 stages.

By irradiating light of AM1.5 with a quantity of light of 100 mW/cm$^2$, thus obtained integrated type silicon based thin film solar cell 6 was measured for an output characteristic. An open circuit voltage (Voc) per one step gave 0.541 V, a Jsc 23.6 mA/cm$^2$, an F. F. 71.7%, and a conversion efficiency 9.2%.

A conversion efficiency was maintained although the integrated type thin film solar cell 6 produced in Example 2 had a larger area than that in Example 1.

Example 3

In Example 3, an integrated type silicon based thin film solar cell 6 was produced almost in a same manner as in Example 2, except for having intentionally set the RMS greater using SiO$_2$ micro-particles 1121 having a particle diameter of 80 nm in formation of the transparent foundation layer 112. An RMS of the transparent foundation layer 112 thus formed on this condition gave 19.3 nm. Although ultrasonic cleaning was given after laser scribe process of a back electrode layer isolation groove 64, a film peeling area on the substrate was not identified.

By irradiating light of AM1.5 with a quantity of light of 100 mW/cm$^2$, thus obtained integrated type silicon based thin film solar cell 6 was measured for an output characteristic. An open circuit voltage (Voc) per one step gave 0.532 V, a Jsc 24.3 mA/cm$^2$, an F. F. 70.5%, and a conversion efficiency 9.1%.

Example 4

In Example 4, an integrated type silicon based thin film solar cell 6 was produced almost in a same manner as in Example 2, except for having intentionally set an RMS greater using SiO$_2$ micro-particles 1121 having a particle diameter of 90 nm in formation of the transparent foundation layer 112. In addition, a film thickness of the crystalline intrinsic silicon photoelectric conversion layer 32 was set at 3.0 micrometers. An RMS of the transparent foundation layer 112 formed on this condition gave 23.0 nm. Although ultrasonic cleaning was given after laser scribe process of a back electrode layer isolation groove 64, a film peeling area on the substrate was not identified, in spite of having given the crystalline intrinsic silicon photoelectric conversion layer 32 a greater thickness.

By irradiating light of AM1.5 with a quantity of light of 100 mW/cm$^2$, thus obtained integrated type silicon based thin film solar cell 6 was measured for an output characteristic. An open circuit voltage (Voc) per one step gave 0.529 V, a Jsc 27.6 mA/cm$^2$, an F. F. 70.0%, and a conversion efficiency 10.2%.

Example 5

In Example 5, an integrated type tandem thin film solar cell 6 was produced using a same substrate 1 for thin film solar cells as in Example 3. Onto a transparent electrode layer 12, formed was an amorphous silicon photoelectric conversion unit 2 consisting of a p type amorphous silicon layer having a thickness of 15 nm, an intrinsic amorphous silicon photoelectric conversion layer having a thickness of 350 nm, and an n type micro crystalline silicon layer having a thickness of 15 nm using a plasma CVD method. Then, a crystalline silicon photoelectric conversion unit 3 was formed in a same manner as in Example 1. A film thickness of the intrinsic crystalline silicon photoelectric conversion layer 32 at this time was set at 2.0 micrometers. Then, a connection groove 63 was formed by a laser scribe method, then as a back face electrode layer 4, an Al doped ZnO 121 having a thickness of 90 nm and Ag 122 having a thickness of 200 nm were sequentially formed by a sputtering technique. Subsequently, a back electrode layer isolation groove 64 was formed to obtain an integrated type tandem silicon based thin film solar cell 6.

By irradiating light of AM1.5 with a quantity of light of 100 mW/cm$^2$, thus obtained integrated type silicon based thin film solar cell 6 was measured for an output characteristic. An open circuit voltage (Voc) per one step gave 1.38 V, a Jsc 13.1 mA/cm$^2$, an F. F. 71.2%, and a conversion efficiency 12.9%.

Comparative Example 1

In Comparative Example 1, a transparent electrode layer 12 comprising ZnO was directly on a glass substrate of 0.7 mm in thickness and measuring 125 mm per side almost in a same manner as in Example, except for having not used a transparent foundation layer 112. An RMS of the surface of the glass substrate 111 gave a value of not more than 0.5 nm.

Onto a transparent electrode layer 12 having a transparent electrode layer isolation groove 62 formed thereon by a laser scribe method as in Example 1, formed sequentially was a crystalline silicon photoelectric conversion layer unit 3 consisting of a p type micro crystalline silicon layer 31 having a thickness of 15 nm, an intrinsic crystalline silicon photoelectric conversion layer 32 having a thickness of 1.5 micrometers, and an n type micro crystalline silicon layer 33 having a thickness of 15 nm, as in Example 1. Then, a connection groove 63 was formed, and Al doped ZnO 121 having a thickness of 90 nm and Ag 122 having a thickness of 200 nm were sequentially formed by a sputtering technique as a back face electrode layer 4. After formation of the back face electrode layer 4, a back electrode layer isolation groove 64 was formed by a laser scribe method. When ultrasonic cleaning was given, film peelings formed in the vicinity of the transparent electrode layer isolation groove 62 in some places were observed. A total amount of peeled area was equivalent to approximately 6% to a total area of the integrated type thin film solar cell 6. Moreover, absence of conductivity in a portion of peeling clearly shows that the film peelings were formed in an interface between the glass substrate 111 and the transparent electrode layer 12.

Generally in deposition of a silicon thin film by a plasma CVD method on a substrate, some internal stress caused by remaining distortion exists in the thin film. Since atoms are regularly arranged within the crystalline silicon layer, particularly, difficulty will be shown in relaxation of remaining distortion. Therefore when an external mechanical force like vibration at the time of ultrasonic cleaning is applied, the external power and internal stress are superimposed, probably serving as a stress causing peelings near the interface between the crystalline photoelectric conversion unit 3 and the transparent electrode layer 12. However, since comparatively large texture exists on a surface of the transparent electrode layer 12, a close contact power by an anchor effect works comparatively strongly. As a result here, peelings may easily be formed between the glass substrates 111 and the transparent electrode layer 12 having a weak close contact power with the glass substrates 111 having a smooth surface by low-temperature formation.

By irradiating light of AM1.5 with a quantity of light of 100 mW/cm$^2$, the integrated type silicon based thin film solar cell 6 obtained as mentioned above was measured for an output characteristic. An open circuit voltage (Voc) per one step gave 0.499 V, a Jsc 22.7 mA/cm$^2$, an F. F. 67.%, and a conversion efficiency 7.6%.

Comparative Example 2

In Comparative Example 2, an integrated type crystalline silicon based thin film solar cell 6 was produced almost in a same manner as in Example 2, except for having formed a transparent electrode layer 12 directly on a glass substrate 111 in a same manner as in Comparative Example 1. Therefore, an RMS of a surface as the transparent insulating substrate 11 gave a value of not more than 0.5 nm.

In Comparative Example 2, when the connection groove 63 was formed, peelings of several films occurred. After formation of an isolation groove 64 in a back face electrode layer 4, peelings were observed in an area equivalent to approximately 15% with respect to a total area of the integrated type thin film solar cell 6.

By irradiating light of AM1.5 with a quantity of light of 100 mW/cm$^2$, the integrated type silicon based thin film solar cell 6 obtained as mentioned above was measured for an output characteristic. An open circuit voltage (Voc) per one step gave 0.473 V, a Jsc 20.9 mA/cm$^2$, an F. F. 65.7%, and a conversion efficiency 6.5%.

In Comparative Example 2, a size of the glass substrate 111 became larger as compared with that of Comparative Example 1, and furthermore the thickness became larger to reduce flexibility. Thereby a result of increased distortion generated between the glass substrate 111 and the transparent electrode layer 12 was reflected in the peeling phenomenon. A large area of film peeling deteriorated all the parameters of the solar cell characteristic.

Comparative Example 3

In Comparative Example 3, an integrated type crystalline silicon based thin film solar cell 6 was produced almost in a same manner as in Example 2, except for having formed a layer only with a metal oxide as a material of transparent binder 1122 without addition of micro-particle component in case of formation of a transparent foundation layer 112. An RMS of the transparent base material 111 surface formed on this condition gave 2.8 nm. Furthermore, a percentage of film peeling after formation of the integrated type thin film solar cell 6 was approximately 10%.

By irradiating light of AM1.5 with a quantity of light of 100 mW/cm$^2$, the integrated type silicon based thin film solar cell 6 obtained as mentioned above was measured for an output characteristic. An open circuit voltage (Voc) per one step gave 0.491 V, a Jsc 21.8 mA/cm$^2$, an F. F. 68.6%, and a conversion efficiency 7.3%.

Comparative Example 4

In Comparative Example 4, an integrated type crystalline silicon based thin film solar cell 6 was produced almost in a same manner as in Example 2, except for having used SiO$_2$ micro-particles 1121 having a particle diameter of 200 nm in case of formation of a transparent foundation layer 112, and for having intentionally enlarged RMS. An RMS of a front face of the substrate formed on this condition gave 66.9 nm. Film peeling was not identified after integrated type thin film solar cell 6 formation.

By irradiating light of AM1.5 with a quantity of light of 100 mW/cm$^2$, the integrated type silicon based thin film solar cell 6 obtained as mentioned above was measured for an output characteristic. An open circuit voltage (Voc) per one step gave 0.452 V, a Jsc 22.0 mA/cm$^2$, an F. F. 60.1%, and a conversion efficiency 6.0%.

In Comparative Example 4, in spite of not having identified film peelings, reduced Eff. lower than those of Comparative Examples 1 to 3 was obtained. Reasons are probably that excessively large particle diameter of used SiO$_2$ micro-particles 1121 enlarged unevenness of the transparent foundation layer 112, and produced many grain boundaries as defects in the ZnO transparent electrode layer 12 to be formed thereon, causing mechanical and electric defects in the crystalline silicon photoelectric conversion unit 3. Therefore it became clear that in case of production of a substrate 1 for thin film solar cells having peeling prevention function using micro-particles with a larger particle diameter, a particle diameter and a difference of a height of unevenness shape of the transparent electrode layer 12 to be formed on the substrate 1 tend to become larger, thereby easily causing mechanical and electric defects of the crystalline solar cell.

Table 1 shows test results of main characteristics of substrates 1 for thin film solar cells and output characteristics in integrated type thin film solar cells 6 using the substrates 1 in Examples 1 to 5 and Comparative Examples 1 to 4. It also shows both of main characteristics of substrates 1 for thin film solar cells and output characteristics in thin film solar cells 5 with a small area using the substrates 1 in Examples 6 to 10 and Comparative Examples 5 to 8 mentioned later.

TABLE 1

| | Particle RMS (nm) | Crystalline silicon film diameter (nm) | Substrate thickness (micrometer) | Film (cell) size (mm) | Visual appearance | peeling rate (%) | Solar cell characteristics Voc (V) | Jsc (mA/cm$^2$) | F.F. | Eff. (%) |
|---|---|---|---|---|---|---|---|---|---|---|
| Example 1 | 7.2 | 50 | 1.5 | 125 × 125 | ○ | 0 | 0.547 | 23.1 | 72.8 | 9.2 |
| Example 2 | 9.8 | 50 | 1.5 | 910 × 455 | ○ | 0 | 0.541 | 23.6 | 71.7 | 9.2 |
| Example 3 | 19.3 | 80 | 1.5 | 910 × 455 | ○ | 0 | 0.532 | 24.3 | 70.5 | 9.1 |
| Example 4 | 23.0 | 90 | 3.0 | 910 × 455 | ○ | 0 | 0.529 | 27.6 | 70.0 | 10.2 |
| Comparative Example 1 | not more than 0.5 | — | 1.5 | 125 × 125 | Δ | 6 | 0.499 | 22.7 | 67.1 | 7.6 |
| Comparative Example 2 | not more than 0.5 | — | 1.5 | 910 × 455 | X | 15 | 0.473 | 20.9 | 65.7 | 6.5 |
| Comparative Example 3 | 2.8 | — | 1.5 | 910 × 455 | Δ | 10 | 0.491 | 21.8 | 68.6 | 7.3 |
| Comparative Example 4 | 66.9 | 200 | 1.5 | 910 × 455 | ○ | 0 | 0.452 | 22.0 | 60.1 | 6.0 |
| Example 5 | 16.1 | 80 | 2.0 | 910 × 455 | ○ | 0 | 1.38 | 13.1 | 71.2 | 12.9 |
| Example 6, 8 | 17.2 | 70 | 1.5 | 10 × 10 | ○ | 0 | 0.515 | 27.8 | 71.1 | 10.2 |
| Example 7, 9 | 32.5 | 95 | 1.5 | 10 × 10 | ○ | 0 | 0.522 | 28.4 | 0.705 | 10.5 |
| Example 10 | 32.5 | 95 | 2.0 | 10 × 10 | ○ | 0 | 1.35 | 13.7 | 0.733 | 13.6 |
| Comparative Example 5, 7 | not more than 0.5 | — | 1.5 | 10 × 10 | ○ | 0 | 0.517 | 26.5 | 70.2 | 9.6 |
| Comparative Example 6, 8 | 3.1 | 8 | 1.5 | 10 × 10 | ○ | 0 | 0.515 | 26.5 | 70.5 | 9.6 |

Results of Table 1 show that film peeling was not identified in any of Examples 1 to 5. In Comparative Examples 1 to 3, small interface unevenness between the transparent insulating substrates 11 and the transparent electrode layers 12 formed at low temperatures gave unsatisfactory close contact power, leading to film peeling. It may be understood that film peeling between the transparent insulating substrates 11 and the transparent electrode layers 12 reduces all of characteristic parameters. Especially a large drop of Voc and F.F. in Comparative Examples clarifies that a film peeling between the transparent insulating substrate 11 and the transparent electrode layer 12 causes increase in series resistance in a integrated type solar cell structure 5 having a plurality of cells 61 connected in series. Since film peeling decreases a light reception area of the power generation layer, a large drop of Voc or F.F. will also cause drop of value of Jsc.

As described in details above, the present invention may provide an integrated type thin film solar cell 6 having improved performance using a substrate 1 for thin film solar cells that can be manufactured at low cost.

Example 6

Figure 5:
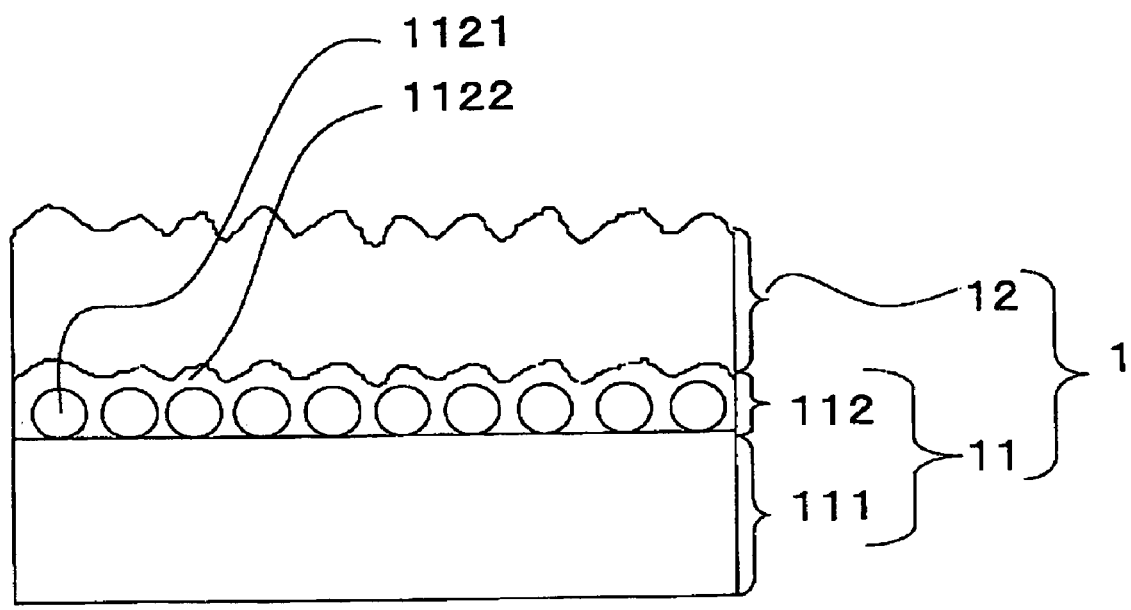
FIG. 5 shows a sectional view of a substrate for thin film solar cells as a second embodiment of the present invention.

As Example 6, a substrate 1 for thin film solar cells in FIG. 5 was produced. A transparent foundation layer 112 having unevenness including SiO$_2$ micro-particles 1121 was formed on a glass substrate 111. A coating liquid used when forming a transparent foundation layer 112 was obtained in a way that tetra ethoxy silane was added to a mixed liquor of dispersion liquid of spherical silica with an average particle diameter of 70 nm, water, and ethyl cellosolve, and hydrochloric acid was further added to hydrolyze the tetra-ethoxy silane. After applying the coating liquid on the glass substrate 111 with a printing machine, the substrate was dried at 90 degrees C. for 30 minutes, and then heated at 350 degrees C. for 5 minutes to obtain a transparent foundation layer 112 having fine unevenness currently formed on a surface thereof. When a surface of this transparent insulating substrate 112 was observed with an atomic force microscope (AFM), recognized was unevenness with a projected area comprising a curved surface influenced by a shape of the micro-particles.

A root-mean-square deviation of the surface (RMS) of the transparent foundation layer 112 formed on this condition gave 17.2 nm. An RMS in the present invention was determined from an image by an atomic force microscope (AFM) obtained by observing an area of square having one side of 5 micrometers (ISO 4287/1). Non contact mode of Nano-R system (made by Pacific Nanotechnology) was used for this AFM measurement.

A haze ratio measured using a C light source of a transparent insulating substrate 11 having only a transparent foundation layer 112 currently formed on a glass substrate 111 gave 0.31%.

Onto the obtained transparent foundation layer 112, a transparent electrode layer 12 comprising ZnO was formed by a low pressure thermal CVD method. This transparent electrode layer 12 was formed on conditions:

a base material temperature of 160 degrees C.;

a pressure of 100 Pa, a flow rate of diethyl zinc (DEZ) 500 sccm;

water 1000 sccm;

a flow rate of diborane ($B_2H_6$) 5 sccm;

a flow rate of Argon 1000 sccm; and a flow rate of hydrogen of 1000 sccm.

The obtained transparent electrode layer 12 comprising ZnO film had a thickness of 1.5 micrometers, and a sheet resistance of 8.7 ohms/□. A haze ratio measured using a C light source of the substrate 1 for thin film solar cells comprising the glass substrate 111, transparent foundation layer 112, and transparent electrode layer 123 gave 27.2%. That is, a haze ratio far exceeding a haze ratio of the transparent foundation layer 112 was obtained by producing the transparent electrode layer 12 by a low pressure thermal CVD method. Since the thin film solar cell substrate 1 having a haze ratio of not less than 20% was obtained at a base material temperature of not less than 150 degrees C., heat damage to the transparent electrode layer 12 at the time of semiconductor layer film-forming may be reduced as compared with a case by conventional methods. Thus obtained substrate 1 was measured for a whole light transmittance by entering light from a glass side using a spectrophotometer, giving a transmittance of not less than 80% in a range of a wavelength of 400 nm to 1200 nm.

Example 7

A substrate 1 for thin film solar cells of FIG. 5 was produced as Example 7. Except for having used a spherical silica dispersion liquid with an average particle diameter of 95 nm, a transparent foundation layer 112 was formed in a same manner as in Example 6. An RMS of this transparent foundation layer 112 gave 32.5 nm. A haze ratio measured using a C light source of a transparent insulating substrate 11 having only a transparent foundation layer 112 currently formed on a glass substrate 111 gave 0.72%.

Onto the obtained transparent foundation layer 112, a transparent electrode layer 12 comprising ZnO was formed by a low pressure thermal CVD method on a same conditions as in Example 6. The obtained transparent electrode layer 12 comprising ZnO film had a thickness of 1.5 micrometers, and a sheet resistance of 9.3 ohm/□. An RMS measured by AFM gave 67.8 nm. A haze ratio measured using a C light source of the substrate 1 for thin film solar cells comprising the glass substrate 111, transparent foundation layer 112, and transparent electrode layer 123 gave 35.7%. Thus obtained substrate 1 was measured for a whole light transmittance by entering light from a glass side using a spectrophotometer, giving a transmittance of not less than 80% in a range of a wavelength of 400 nm to 1200 nm. Example 7 has still larger unevenness of a foundation layer 2 as compared with a case in Example 6, and a haze ratio increased.

Comparative Example 5

As a substrate 1 for thin film solar cells of Comparative Example 5, ZnO layer 12 was directly formed on a glass substrate 111 without a transparent foundation layer 112 by a low pressure thermal CVD method. Film-forming conditions of ZnO layer are same as that of Example 6. An RMS of the glass substrate 111 gave not more than 0.5 nm, the value was not more than a limit of measurement of AFM, and this means that the substrate was flat. A haze ratio of the glass substrate 111 measured using a C light source was not more than 0.01%, and was not more than a limit of measurement. The obtained transparent electrode layer 12 comprising ZnO film had a thickness of 1.5 micrometers, and a sheet resistance of 8.3 ohms/□. A haze ratio measured using a C light source of the substrate 1 for thin film solar cells of Comparative Example 5 concerned gave 15.1%. Thus obtained substrate 1 was measured for a whole light transmittance by entering light from a glass side using a spectrophotometer, giving a transmittance of not less than 80% in a range of a wavelength of 400 nm to 1200 nm. It had a haze ratio as small as approximately half as compared with that in Example 6 by a same film thickness of ZnO layer 12.

Comparative Example 6

A substrate 1 for thin film solar cells was produced as Comparative Example 6. Except for having used a spherical silica dispersion liquid having an average particle diameter of 8 nm, a transparent foundation layer 112 was formed in a same manner as in Example 6. An RMS of this foundation layer 112 gave 3.1 nm. A haze ratio measured using a C light source of the glass substrate 111 having only a foundation layer 112 currently formed gave not more than 0.01%, and this value was not more than a limit of measurement. Onto the obtained foundation layer 2, a transparent electrode layer 12 comprising ZnO was formed by a low pressure thermal CVD method on a same conditions as in Example 6. The obtained transparent electrode layer 12 comprising ZnO film had a thickness of 1.5 micrometers, and a sheet resistance of 8.5 ohms/□. A haze ratio measured using a C light source of the substrate 1 for thin film solar cells comprising the glass substrate 111, foundation layer 112, and transparent electrode layer 12 gave 15.5%. Thus obtained substrate 1 was measured for a whole light transmittance by entering light from a glass side using a spectrophotometer, giving a transmittance of not less than 80% in a range of a wavelength of 400 nm to 1200 nm.

A haze ratio of Comparative Example 6 is almost equivalent to that of Comparative Example 5, and when unevenness of the foundation layer 112 was small and RMS was also small, almost no effect of improving a haze ratio by the foundation layer 2 was observed.

Example 8

Figure 7:
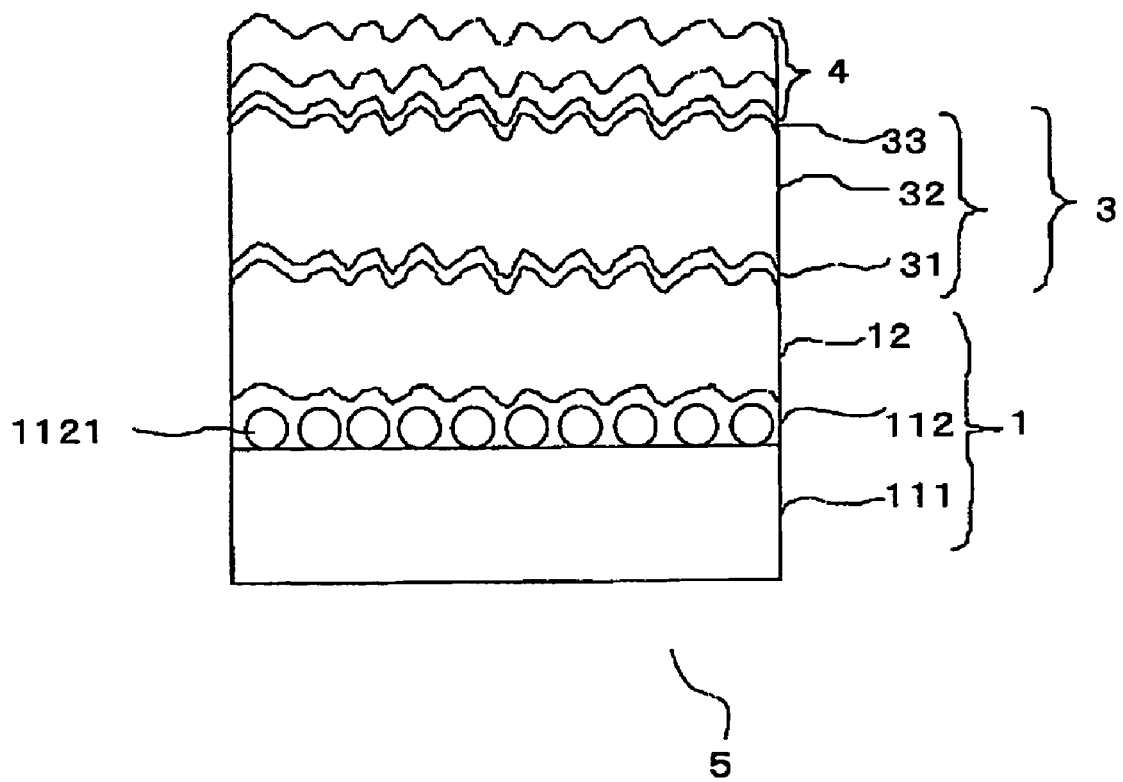
FIG. 7 shows a sectional view of a thin film solar cell as a fourth embodiment of the present invention.

A thin film solar cell 5 having structure of FIG. 7 and being of a square measuring 10 mm per side was produced using a substrate 1 for thin film solar cells of Example 6. Onto a transparent electrode layer 12 of substrate 1 for thin film solar cells, formed sequentially was a crystalline photoelectric conversion layer unit 3 consisting of one conductivity type layer 31 of p type micro crystalline silicon having a thickness of 15 nm, an intrinsic crystalline photoelectric conversion layer 32 of intrinsic crystalline silicon having a thickness of 1.5 micrometers, and a reverse conductivity type layer 33 of n type micro crystalline silicon having a thickness of 15 nm by a plasma CVD method. Then, a conductive oxide layer of Al doped ZnO having a thickness of 90 nm and a metal layer of Ag having a thickness of 300 nm were sequentially formed by a sputtering technique as a back face electrode layer 4.

Thus obtained silicon based thin film solar cell 5 was measured for an output characteristic by irradiating light of AM1.5 with a quantity of light 100 mW/cm$^2$, giving an open circuit voltage of 0.515 V (Voc), a short circuit current density (Jsc) of 27.8 mA/cm$^2$, a fill factor (F. F.) of 0.711, and a conversion efficiency of 10.2%.

Comparative Example 7

A thin film solar cell 5 was produced using a substrate 1 for thin film solar cells of Comparative Example 5 as Comparative Example 7. Except for not having used a foundation layer 112, a structure of the thin film solar cell and a manufacturing method were same as those of Example 8. Thus obtained silicon based thin film solar cell 5 was measured for an output characteristic by irradiating light of AM1.5 with a quantity of light 100 mW/cm$^2$, giving a Voc of 0.517 V, a Jsc of 26.5 mA/cm$^2$, an F.F. of 0.702, and a conversion efficiency of 9.6%. Since the substrate 1 had a lower haze ratio as compared with the thin film solar cell in Example 8, inadequate light trapping effect and a reduced short circuit current density were shown, giving a low conversion efficiency.

Comparative Example 8

A thin film solar cell 5 was produced using a substrate 1 for thin film solar cells of Comparative Example 6 as Comparative Example 8. Except for having used a dispersion liquid of spherical silica having an average particle diameter of 8 nm when forming a foundation layer 112, a structure of a thin film solar cell, and manufacturing method were same as those of Example 8. Thus obtained silicon based thin film solar cell 5 was measured for an output characteristic by irradiating light of AM1.5 with a quantity of light 100 mW/cm$^2$, giving a Voc of 0.515 V, a Jsc of 26.5 mA/cm$^2$, an F.F. of 0.705, and a conversion efficiency of 9.6%. Since the board had an almost same haze ratio as in the case of Comparative Example 7, it had an equivalent Jsc, and conversion efficiency to those of Comparative Example 7.

Example 9

A thin film solar cell 5 of FIG. 7 was produced using a substrate 1 for thin film solar cells of Example 7 as Example 9. Except for having used a dispersion liquid of spherical silica having an average particle diameter of 100 nm, a structure of the thin film solar cell and manufacturing method when forming a foundation layer 112 were same as those of Example 8. Thus obtained silicon based thin film solar cell 5 was measured for an output characteristic by irradiating light of AM1.5 with a quantity of light 100 mW/cm$^2$, giving a Voc of 0.522 V, a Jsc of 28.4 mA/cm$^2$, an F.F. of 0.705, and a conversion efficiency of 10.5%. Since a haze ratio of the substrate increased as compared with that of the thin film solar cell of Example 8, Jsc also increased, resulting in an improved conversion efficiency.

Example 10

Figure 8:
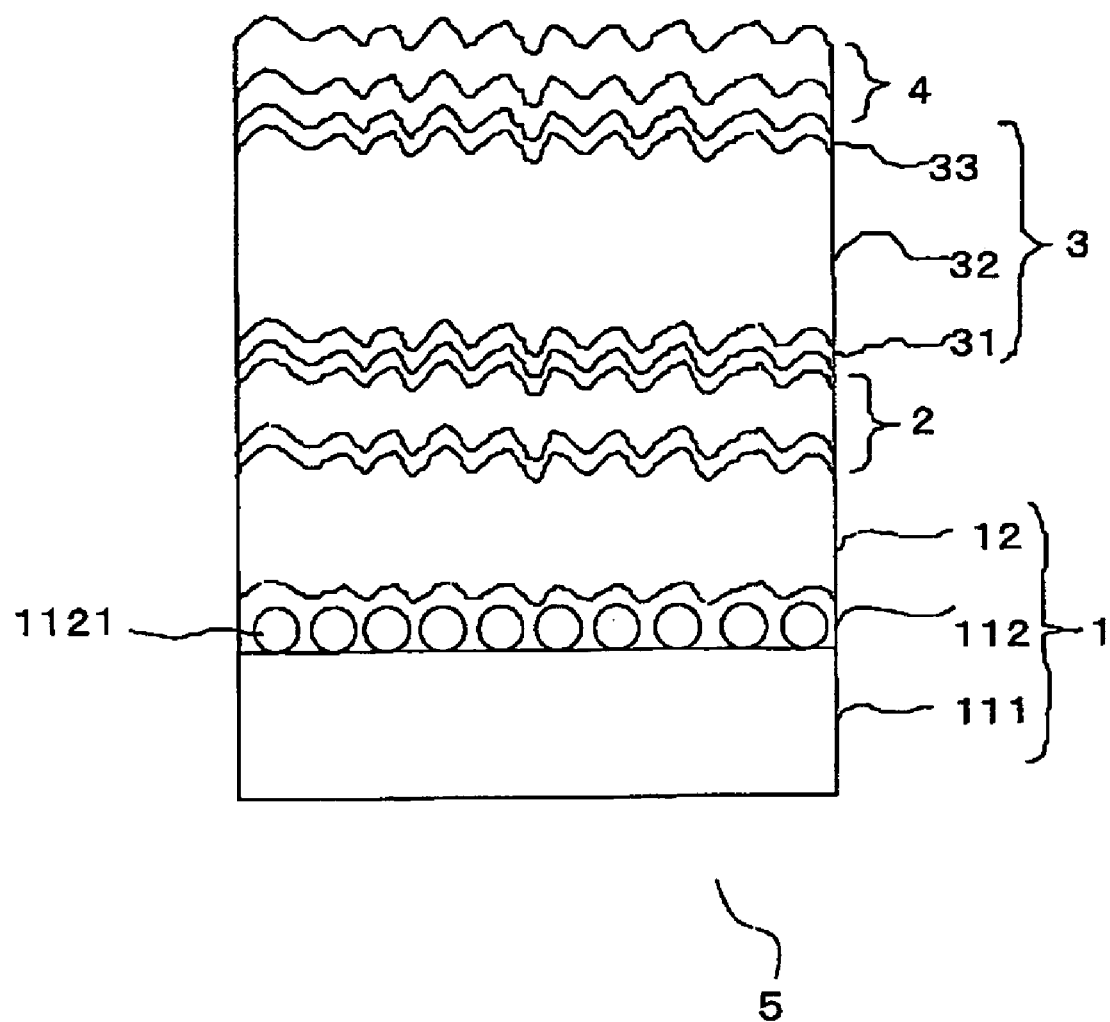
FIG. 8 shows a sectional view of a tandem type thin film solar cell as a fifth embodiment of the present invention.

In Example 10, a tandem type thin film solar cell 5 of FIG. 8 was produced using a substrate 1 for thin film solar cells of Example 7. Onto a transparent electrode layer 12 of the substrate 1 for thin film solar cells, formed was by a plasma CVD method an amorphous photoelectric conversion unit 2 consisting of a front one conductivity type layer made of p type amorphous silicon carbide having a thickness of 15 nm, an amorphous photoelectric conversion layer made of intrinsic amorphous silicon having a thickness of 350 nm, and a front reverse conductivity type layer made of n type micro crystalline silicon having a thickness of 15 nm. Then, a crystalline photoelectric conversion unit 3 was formed in a same manner as in Examples 8 and 9. However, a film thickness of the intrinsic crystalline photoelectric conversion layer 32 of the crystalline photoelectric conversion unit 3 was set at 2.0 micrometers. Then, a conductive oxide layer of Al doped ZnO having a thickness of 90 nm, and a metal layer of Ag having a thickness of 300 nm were sequentially formed by a sputtering technique as a back face electrode layer 4 to obtain a tandem type thin film solar cell 5.

Thus obtained tandem type thin film solar cell 5 was measured for an output characteristic by irradiating light of AM1.5 with a quantity of light 100 mW/cm$^2$, giving a Voc of 1.35 V, a Jsc of 13.7 mA/cm$^2$, an F.F. of 0.733, and a conversion efficiency of 13.6%.

Table 1 shows main characteristics of substrates for thin film solar cells by Examples 6 to 10 and Comparative Examples 5 to 8, and output characteristics in thin film solar cells having a small area using the substrates. As compared with the solar cell characteristics of Comparative Examples 7 and 8, solar cells of Examples 8 and 9 have especially improved Jsc, and demonstrate improved characteristics. In neither Comparative Examples nor Examples, defects of visual appearance and film peelings were observed in cells having a small area.

As described in details above, according to the present invention film-formation of a transparent electrode layer 12 onto a foundation layer 112 having unevenness, using a low pressure thermal CVD, at base material temperatures of not less than 150 degrees C. enables effective increase in unevenness of a substrate 1 for thin film solar cells and can provide the substrate 1 for thin film solar cells having large light trapping effect. Moreover, adoption of this substrate 1 for thin film solar cells to a thin film solar cell 5 increases power generation electric current with light trapping effect, leading to improvement in performance of the thin film solar cell 5. Furthermore, since a haze ratio does not drop but rather increases at base material temperatures of not less than 150 degrees C., enabled is film-formation of the transparent electrode layer 12 at base material temperatures higher than that in conventional methods, and also heat damage to the transparent electrode layer 12 at the time of semiconductor layer production may be controlled, resulting in improvement in performance and reliability of the thin film solar cell 5.

INDUSTRIAL APPLICABILITY

The present invention may effectively increase unevenness of a substrate having a transparent electrode layer using inexpensive manufacturing method, and as a result may provide a substrate for thin film solar cells having large light trapping effect. Adoption of this substrate for thin film solar cells to a thin film solar cell can increase power generation electric current, and can improve performance of the thin film solar cell with light trapping effect. Furthermore, production of a substrate for thin film solar cells having a transparent electrode layer with large unevenness has become possible at base material temperatures not less than 150 degrees C. Heat damage to the transparent electrode layer at the time of semiconductor layer production is controlled and coexistence of the light trapping effect and low resistance value may be realized, leading to effect over improvement in performance and reliability of the thin film solar cell. Furthermore, the present invention can demonstrate effect for controlling film peeling in integrated type thin film solar cells, and provide a substrate for thin film solar cells having high photoelectric conversion efficiency at low cost.

The invention claimed is:

1. A substrate for thin film solar cells consisting of a transparent insulating substrate, and a transparent electrode layer including at least zinc oxide deposited on the transparent insulating substrate,
    wherein the transparent insulating substrate has a fine surface unevenness having a root-mean-square deviation of the surface of 5 to 50 nm in an interface by a side of the transparent electrode layer, and
    a projected area consists of a curved surface,
    wherein the transparent insulating substrate consists of stacked layer of a transparent base material having a smooth surface, and a transparent foundation layer, and the transparent foundation layer comprises transparent micro-particles having an average particle diameter of not less than 10 nm and not more than 95 nm, and a transparent binder.

2. The substrate for thin film solar cells according to claim 1, wherein the transparent electrode layer has a film thickness of not less than 1 micrometer.

3. The substrate for thin film solar cells according to claim 1, wherein a haze ratio measured as a ratio of a diffuse transmittance to a total transmittance using a C light source is not less than 20%.

4. A thin film solar cell comprising the substrate for thin film solar cells according to claim 1.

5. An integrated type thin film solar cell, comprising the substrate for thin film solar cells according to claim 1, and at least one crystalline photoelectric conversion unit layer and a back face electrode layer deposited on the transparent electrode layer, wherein the layers are further isolated by a plurality of isolation grooves so as to form a plurality of photoelectric conversion cells, and the plurality of photoelectric conversion cells are mutually electrically connected in series via a plurality of connection grooves.

6. A method for manufacturing a substrate for thin film solar cells according to claim 1, wherein the transparent electrode layer including at least zinc oxide are deposited at temperatures of the transparent insulating substrate of not less than 150 degrees C.

7. The substrate for thin film solar cells according to claim 1, wherein the transparent foundation layer comprises transparent micro-particles having an average particle diameter of not more than 90 nm.

8. The substrate for thin film solar cells according to claim 1, wherein the transparent foundation layer comprises transparent micro-particles having an average particle diameter of not more than 80 nm.

9. The substrate for thin film solar cells according to claim 1, wherein the transparent foundation layer comprises transparent micro-particles having an average particle diameter of not more than 70 nm.

* * * * *